United States Patent
Lee et al.

(10) Patent No.: US 9,870,293 B2
(45) Date of Patent: Jan. 16, 2018

(54) MEMORY DEVICE PERFORMING POST PACKAGE REPAIR (PPR) OPERATION

(71) Applicant: SAMSUNG ELECTRONICS CO., LTD., Suwon-si, Gyeonggi-Do (KR)

(72) Inventors: Seong-Jin Lee, Hwaseong-si (KR); Ju-Yun Jung, Hwaseong-si (KR); Yoo-Jung Lee, Daejeon (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/345,592

(22) Filed: Nov. 8, 2016

(65) Prior Publication Data
US 2017/0185499 A1    Jun. 29, 2017

(30) Foreign Application Priority Data
Dec. 24, 2015    (KR) .......................... 10-2015-0186777

(51) Int. Cl.
| G11C 11/34 | (2006.01) |
| G06F 11/20 | (2006.01) |
| G11C 7/12 | (2006.01) |
| G11C 8/08 | (2006.01) |

(52) U.S. Cl.
CPC ............ G06F 11/2094 (2013.01); G11C 7/12 (2013.01); G11C 8/08 (2013.01); *G06F 2201/805* (2013.01); *G06F 2201/82* (2013.01)

(58) Field of Classification Search
CPC ......... G11C 7/12; G11C 8/08; G06F 11/2094; G06F 2201/805; G06F 2201/82
See application file for complete search history.

(56) References Cited

U.S. PATENT DOCUMENTS

| 5,355,337 A | 10/1994 | Kim |
| 5,440,517 A | 8/1995 | Morgan et al. |
| 5,727,001 A | 3/1998 | Loughmiller |
| 5,754,559 A | 5/1998 | Nevill |
| 5,907,511 A | 5/1999 | Crafts |
| 5,982,682 A | 11/1999 | Nevill et al. |
| 6,097,644 A | 8/2000 | Shirley |
| 6,868,021 B2 | 3/2005 | Tanabe et al. |
| 7,450,458 B2 | 11/2008 | Mori et al. |
| 8,023,350 B2 | 9/2011 | Bunker et al. |
| 9,213,491 B2 * | 12/2015 | Mozak ................ G06F 3/0619 |
| 9,343,184 B2 * | 5/2016 | Wilson ................ G11C 29/70 |
| 9,401,227 B2 * | 7/2016 | Noh ...................... G11C 29/78 |
| 9,418,762 B1 * | 8/2016 | You ...................... G11C 29/78 |
| 9,576,629 B2 * | 2/2017 | Song .................... G11C 29/785 |
| 2016/0217873 A1 * | 7/2016 | Noh ...................... G11C 29/78 |

* cited by examiner

*Primary Examiner* — Pho M Luu
(74) *Attorney, Agent, or Firm* — Volentine & Whitt, PLLC

(57) ABSTRACT

A memory device including; a memory cell array including memory cells connected to word lines and bit lines, and redundancy memory cells connected to a redundancy word line and the bit lines, and control logic configured to control execution of a post package repair operation by the memory device. The control logic includes a PPR control circuit that programs a bad row address to a non-volatile memory during a normal PPR operation in response to the normal PPR command, and programs the bad row address to a volatile memory during a fast PPR operation in response to the fast PPR command, and replaces the bad row in the memory cell array with a redundancy row associated with the redundancy word line.

19 Claims, 15 Drawing Sheets

FIG. 10A

| PPR OPERATION | A14 | A15 |
|---|---|---|
| PPR with ROW COPY | 0 | 0 |
| sPPR with ROW COPY | 0 | 1 |
| PPR with DATA '0' WRITE | 1 | 0 |
| sPPR with DATA '0' WRITE | 1 | 1 |

MEMORY DEVICE PERFORMING POST PACKAGE REPAIR (PPR) OPERATION

CROSS-REFERENCE TO RELATED APPLICATION

This application claims the benefit of Korean Patent Application No. 10-2015-0186777 filed on Dec. 24, 2015, the subject matter of which is hereby incorporated by reference.

BACKGROUND

The inventive concept relates to semiconductor devices, and more particularly, to semiconductor devices that perform one or more post package repair (PPR) operation(s).

Semiconductor memory devices usually include one or more memory cell arrays (e.g., two dimensional and/or three dimensional) including memory cells arranged in a matrix of rows and columns. Memory devices often include so-called "redundancy memory cells" that may be used to functionally replace bad memory cell(s) identified among memory cells of a memory cell array. It is common to replace a row of memory cells containing one or more bad memory cells with a row of redundancy memory cells, "redundancy row". A collection of steps required to replace a row of memory cells with a corresponding redundancy row may be termed a "repair operation". In this context, a PPR operation refers to a repair operation that is performed after a memory device has been packaged.

As integration density of contemporary memory devices increases and semiconductor manufacturing processes become ever more fine, single memory cell failures have increased. In a PPR operation, a bad row having as few as a single bit failure may be replaced by a redundancy row. However, since the memory cells connected to the redundancy row will store unknown data, it is possible that the blind replacement of a bad row with a redundancy row might introduce additional bits errors into the data stored (or attempted to be stored) in the bad row.

SUMMARY

Embodiments of the inventive concept provide memory devices and memory systems capable of performing various post package repair (PPR) operations that avoid the introduction of additional bit errors into store data.

According to an aspect of the inventive concept, there is provided a memory device that receives from a memory controller a bad row address designating a bad row associated with a bad word line and one of a normal post package repair (PPR) command and a fast PPR (sPPR) command. The memory device includes; a memory cell array including memory cells connected to word lines and bit lines, and redundancy memory cells connected to a redundancy word line and the bit lines, and control logic configured to control execution of a PPR operation by the memory device. The control logic includes a PPR control circuit that programs the bad row address to a non-volatile memory during a normal PPR operation in response to the normal PPR command, and programs the bad row address to a volatile memory during a fast PPR operation in response to the fast PPR command, and replaces the bad row in the memory cell array with a redundancy row associated with the redundancy word line.

According to an aspect of the inventive concept, there is provided a memory device that receives from a memory controller a bad column address designating a bad column associated with a bad bit line and one of a normal post package repair (PPR) command and a fast PPR (sPPR) command. The memory device includes; a memory cell array including memory cells connected to word lines and bit lines, and redundancy memory cells connected to a redundancy bit line and the word lines, and control logic configured to control execution of a PPR operation by the memory device. The control logic comprises a PPR control circuit that programs the bad column address to a non-volatile memory during a normal PPR operation in response to the normal PPR command, and programs the bad column address to a volatile memory during a fast PPR operation in response to the fast PPR command, and replaces the bad column in the memory cell array with a redundancy column associated with the redundancy bit line.

According to an aspect of the inventive concept, there is provided a method of operating a memory device. The method includes; entering a one of a normal post package repair (PPR) mode or a fast PPR mode in response to a received PPR command and a bad address, storing the bad address in a bad address storage, and writing data to redundancy memory cells replacing memory cells selected by the bad address.

BRIEF DESCRIPTION OF THE DRAWINGS

Embodiments of the inventive concept will be more clearly understood from the following detailed description taken in conjunction with the accompanying drawings in which:

FIG. 10A is a table listing relationships between address signals and various PPR operations and FIG. 10B is a timing diagram further illustrating various PPR operations that may be executed by a memory system and memory device according to embodiments of the inventive concept;

DETAILED DESCRIPTION

Embodiments of the inventive concept will be described in some additional detail with reference to the accompanying drawings. The inventive concept may, however, be embodied in many different forms and should not be construed as limited to only the illustrated embodiments. Rather, these embodiments are provided so that this disclosure will be thorough and complete, and will fully convey the scope of the inventive concept to one of ordinary skill in the art. Throughout the written description and drawings, like reference numbers and labels will be used to denote like or similar elements.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items.

Figure 1:
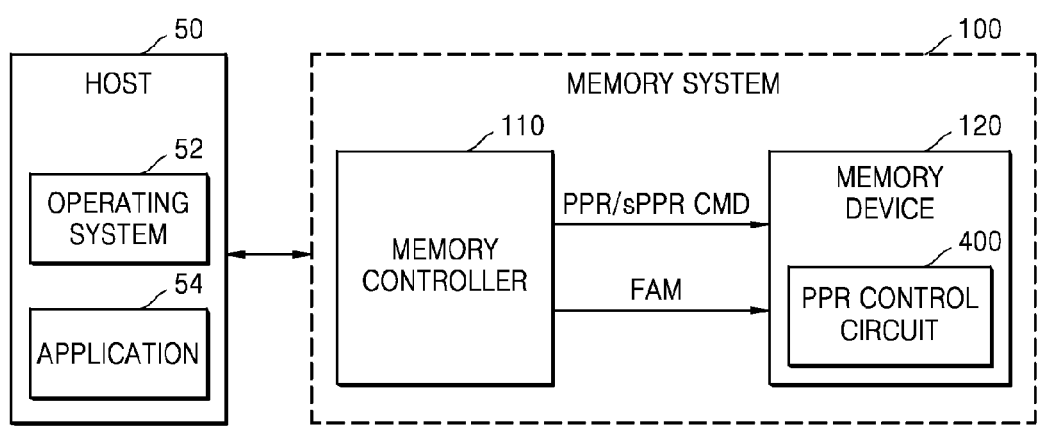
FIG. 1 is a block diagram illustrating a memory system including a post package repair (PPR) control circuit according to an embodiment of the inventive concept.

Figure (FIG. 1 is a block diagram illustrating a host 50 connected to a memory system 100 including a post package repair (PPR) control circuit according to an embodiment of the inventive concept.

Referring to FIG. 1, the memory system 100 performs at least write operations and read operations in response to various input/output (I/O) requests received from the host 50. In FIG. 1, the memory system 100 generally includes a memory controller 110 and a memory device 120.

The host 50 may be an electronic device, such as a computer, a laptop computer, a smart phone, a smart pad, a smart TV, and a netbook. The host 50 may access the memory system 100 in conjunction with execution of one or more application(s) 54 running an one or more operating system(s) 52.

During the execution of read/write operations or other memory access operations in response to host requests, the memory system 100 may provide post package repair commands (e.g., PPR and/or sPPR commands as described hereafter) and an associated bad address (e.g., a bad address listed in a Fault Address Map or FAM) from the memory controller 110 to the memory device 120. In the context of the illustrated embodiments, a "PPR command" (or "normal PPR command") is a command that causes the execution of a post-package repair operation in response to a bad address FAM stored in a non-volatile memory. Thus, PPR commands consistent with an embodiment of the inventive concept may result in (1) the storing of a bad addressFAM in a non-volatile memory of the memory system 100, and (2) the performing of a post-package repair operation with reference to the non-volatilely stored bad address. In contrast, an "sPPR command" (or "fast PPR command") is a command that causes the execution of a post-package repair operation in response to a bad address stored in a volatile memory of the memory system 100. Thus, sPPR commands consistent with an embodiment of the inventive concept may result in (1) the storing of a bad address in a volatile memory, and (2) the performing of post-package repair operation with reference to the volatilely stored bad address.

With respect to the foregoing, those skilled in the art will recognize that it is possible to performed certain "pre-package" bad memory cell correction (or repair) operations before a die (or chip) is packaged into a semiconductor memory device. In contrast, certain other "post-package" bad memory cell repair operations may be performed after a die has been packaged into a semiconductor memory device. The inventive concept described herein with reference to the illustrated embodiments relates to the post-package type of bad memory cell repair operations.

With respect to the foregoing it should also be noted that a bad address corresponding to a PPR command and stored in a non-volatile memory will not be lost (e.g.,) due to the loss of electrical power applied to the memory system 100. However, a bad address corresponding to an sPPR command and temporarily stored in a volatile memory may be lost (or become invalid) if power is lost by the memory system 100. Accordingly, a bad memory cell repair operation executed in response to an sPPR command may be referred to as a "soft repair operation", whereas a bad memory cell repair operation executed in response to a PPR command may be referred to as a "hard repair operation".

With reference to FIG. 1, the memory device 120 may include a plurality of banks, where each bank includes memory cells connected in relation to a matrix of word lines and bit lines. Assuming this arrangement of word lines and bit lines, redundancy memory cells may be connected to one or more redundancy word lines and/or one or more redundancy bit lines. Thus, memory cells capable of being accessed by read/write operations directed to a particular bank of the memory device 120 may be variously accessed in relation to a word line among a plurality of word lines, a bit line among a plurality of bit lines, a redundancy word line among a plurality of redundancy word lines, and/or a redundancy bit line among a plurality of redundancy bit lines.

The memory device 120 may store a bad address in either a non-volatile memory or a volatile memory according to the type of post package repair (PPR/sPPR) command received. The memory device 120 may functionally replace a bad word line designated (or selected) by the bad address with a redundancy word line. Alternately or additionally, the memory device 120 may replace a bad bit line designated by the bad address with a redundancy bit line.

The memory device 120 of FIG. 1 includes a PPR control circuit 400 that controls, for example, the memory device 120 in its execution of PPR operations that enable the writing of data to (and reading of data from) redundancy memory cells connected (e.g.) to a redundancy word line replacing a bad word line.

According to an embodiment, the memory device 120 may perform an internal bank copy operation under the control of the PPR control circuit 400 in response to a PPR/sPPR command, such that data of memory cells connected to a bad word line designated within a first bank is read from (i.e., detected and amplified by a sense amplifier associated with) the first bank, and written to redundancy memory cells connected to a redundancy word line.

According to another embodiment, the memory device 120 may perform an internal bank copy operation under the control of the PPR control circuit 400 in response to a PPR/sPPR command, such that data of memory cells connected to a bad word line designated within a first bank is read from (i.e., detected and amplified by a sense amplifier associated with) the first bank, passed (or transmitted) to a read/write circuit, and then written to redundancy memory cells connected to a redundancy word line of a second bank different from the first bank.

According to still another embodiment, the memory device 120 may perform a PPR operation under the control of the PPR control circuit 400 in response to a PPR/sPPR command, such that data is written to redundancy memory cells connected to a redundancy bit line replacing a bad bit line designated by a bad address.

According to still another embodiment, the memory device 120 may write all '0' or all '1' data to redundancy memory cells connected to a redundancy word line replacing a bad word line under the control of the PPR control circuit 400 in response to a PPR/sPPR command.

Figure 2:
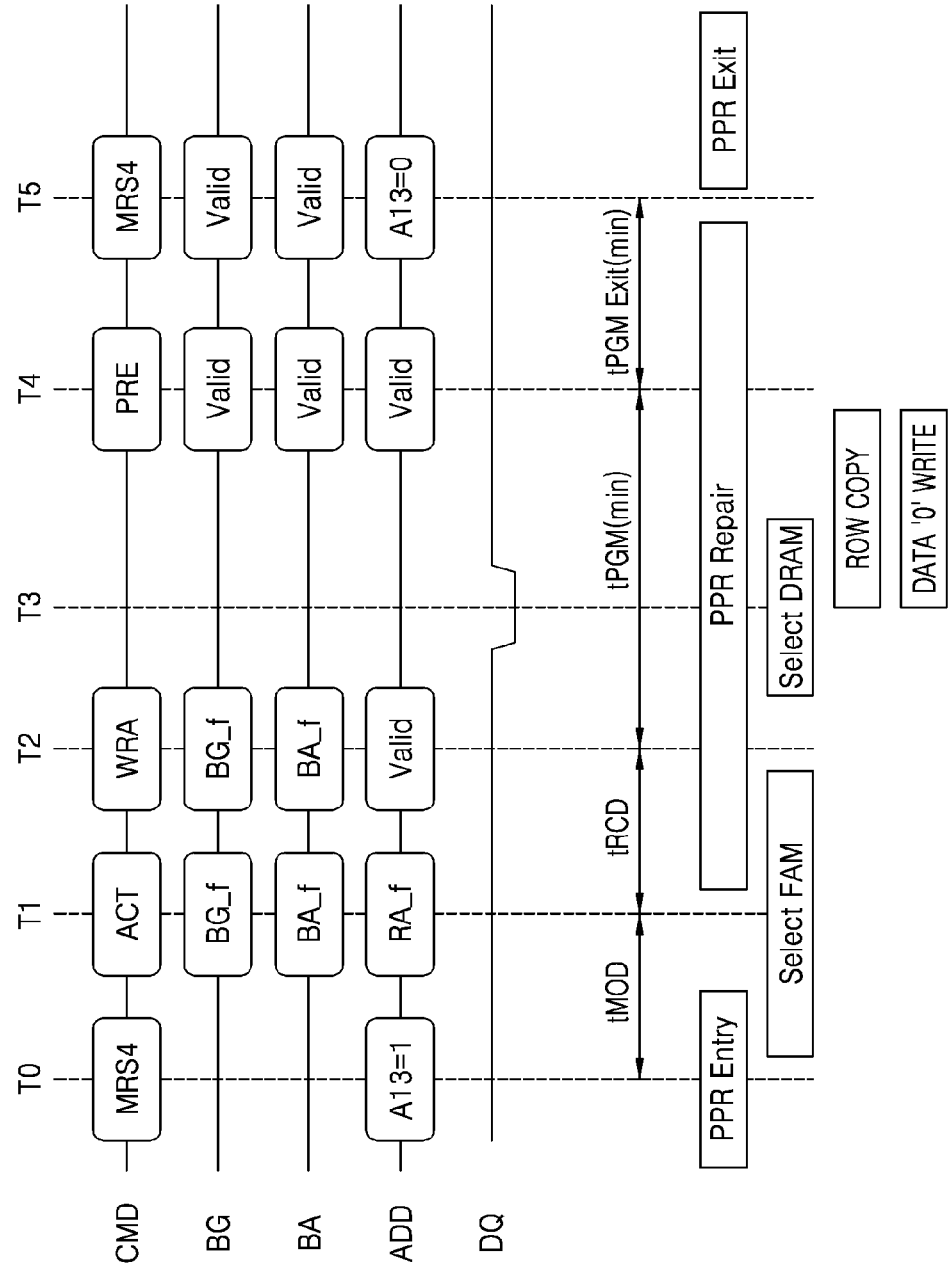
FIG. 2 is a timing diagram further illustrating the execution of a PPR operation by the memory system 100 and memory device 120 of FIG. 1.

FIG. 2 is a timing diagram further illustrating in one example a PPR operation that may be performed by the memory device 120 of FIG. 1.

Referring to FIGS. 1 and 2, at a time T0, the combination of a mode register command MRS4 and an address signal (e.g., A13) cause the memory system 120 to enter a PPR mode. For example, the mode register command MRS4 may be used to indicate the PPR mode and the address signal A13 may be input as a logical '1', thereby causing the memory device 120 to enter the PPR mode.

At a time T1 following T0 (i.e., a duration that may be set by a time mode value tMOD), a bank group address BG_f, a bank address BA_f, and a row address RA_f, collectively indicating the location of a bad memory cell, are input along with an active command ACT. That is, the bank group address BG_f, bank address BA_f, and row address RA_f may be used to indicate a bad address FAM that may be selected by memory device 120. In the context of this example, it should be noted that during an initialization of the memory device 120, the time mode value tMOD may be defined in relation to a minimal time period allowed between an MRS command and a non-MRS command, where the time mode value tMOD may therefore define a minimal time period required before the memory device 120 may enter the PPR mode.

At a time T2, which may be defined by a time tRCD (e.g., Ras to Cas delay time) after the time T1, the bank group address BG_f, the bank address BA_f, and a valid address (Valid) are input to the memory device 120 along with a write command WRA. The memory device 120 may not care that the bank group address BG_f, the bank address BA_f, and the valid address are input along with the write command WRA.

At a time T3 following time T2, the memory device 120 may determine whether the logic state of a data pad DQ is '0.' If the logic state of the data pad DQ is '0,' the corresponding memory device 120 may be a target. If the logic state of the data pad DQ is '1,' the corresponding memory device 120 may not be a target. Here, the term 'target' may refer to a memory device performing a PPR operation among a number of memory devices in the memory system 100. The time period between the time T2 and the time T3 may be defined by a write latency WL, whereas the write latency WL may include a Cas write latency CWL, an additive latency AL, etc.

After the memory device 120 at the time T3 and upon determining that the memory device 120 is the target, the memory device 120 may store the bad address (FAM) input along with the active command ACT in a bad address storage 415. (See, FIG. 4 described hereafter). The bad address storage 415 may include a non-volatile memory, such as an anti-fuse, and a volatile memory, such as a flip-flop. A program time tPGM may refer to a minimal time period required for programming the bad address FAM to the non-volatile memory of the bad address storage 415.

After the bad address is programmed to the non-volatile memory of the bad address storage 415, a pre-charge command PRE is input at a time T4 and the memory device 120 is in an active state. At a time T5, the address signal A13 may be input as a logical '0' along with the mode register command MRS4 in order to exit the PPR mode. A program time tPGM_Exit between time T4 and time T5 may refer to a minimal time period required to exit the PPR mode.

During the PPR operation illustrated in FIG. 2, the (normal) program time tPGM required to normally program (i.e., using a normal PPR operation) the bad address to the non-volatile memory of the bad address storage 415 may vary from between hundreds of milliseconds and several seconds. Under certain conditions, the operating system 52 of host 50 may determine that the normal program time tPGM is a timeout specification violation. To prevent from happening, the memory device 120 may employ an sPPR (or fast PPR) operation that temporarily stores the bad address in a volatile memory of the bad address storage 415 during a (fast) program time tPGM. This alternative approach assumes that the fast program (or write) time tPGM associated with the sPPR operation according to an embodiment of the inventive concept only requires about dozens of nanoseconds.

After the PPR/sPPR operation is performed, a bad row designated by the bad address stored in the bad address storage 415 may be repaired by replacing it with a redundancy row. However, the memory cells connected to the redundancy row will be storing data having an undefined or unknown state. This being the case, the redundancy row— which may be intended to repair (e.g.,) a bad row including as few as a single bad memory cell (or a single bit failure)— may instead result in a multi-bit failure. To prevent this outcome, the memory device 120 may perform a row copy operation as well as a write (or program) operation that effectively writes all 0's, all 1's, or some known pattern of 0's and 1's to the memory cells of the redundancy row. This functional combination of a row copy operation and a known-data write operation may be controlled by the PPR control circuit 400.

Hereinafter, referring to FIGS. 3, 4A, 4B, 5, 6, 7, 8, 9, 10A and 10B (inclusively, "FIGS. 3 through 10"), possible system configurations and operations for the PPR control circuit 400 of FIG. 1 will be described in some additional detail in relation to embodiments of the inventive concept.

Figure 3:
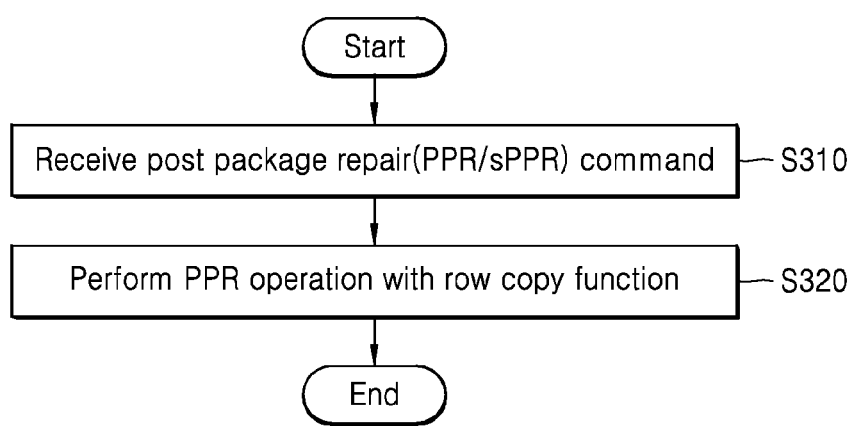
FIG. 3 is a flowchart summarizing in one example a PPR operation including a row copy operation that may be executed by a memory device according to an embodiment of the inventive concept.

FIG. 3 is a flowchart summarizing in one example a PPR operation including a row copy operation that may be executed by a memory system according to embodiments of the inventive concept.

Referring to FIGS. 1, 3 and 4, the memory device 120 receives a PPR/sPPR command from the memory controller 110 (S310). The PPR/sPPR command causes the memory device 120 to store a bad address provided by the memory controller 110 in the bad address storage 415. In this regard, the nature and/or configuration of the PPR/sPPR command may be determined in accordance with the interface and/or protocol between the host 50 and memory system 100.

In response to the PPR/sPPR command, the PPR control circuit 400 of the memory device 120 may perform the requested PPR operation (S320). As described above with reference to FIG. 2, the PPR control circuit 400 may perform the PPR operation in such a manner that the memory device 120 enters a corresponding PPR mode, selects a bad address along with an active command ACT, receives a write command, determines whether the memory device 120 is the target by checking a data pad DQ in response to the write command, writes/programs the bad address to the bad address storage 415 when the memory device 120 is determined to be the target, receives a pre-charge command after the writing/programming operation is completed, and exits the PPR mode.

In addition to the PPR operation described above, the PPR control circuit 400 may further perform a row copy operation with respect to a redundancy row designated to replace a bad row. Possible embodiments of the row copy operation for writing data to the memory cells of the redundancy row will be described hereafter in some additional detail with reference to FIGS. 6 and 7.

Figure 4A:
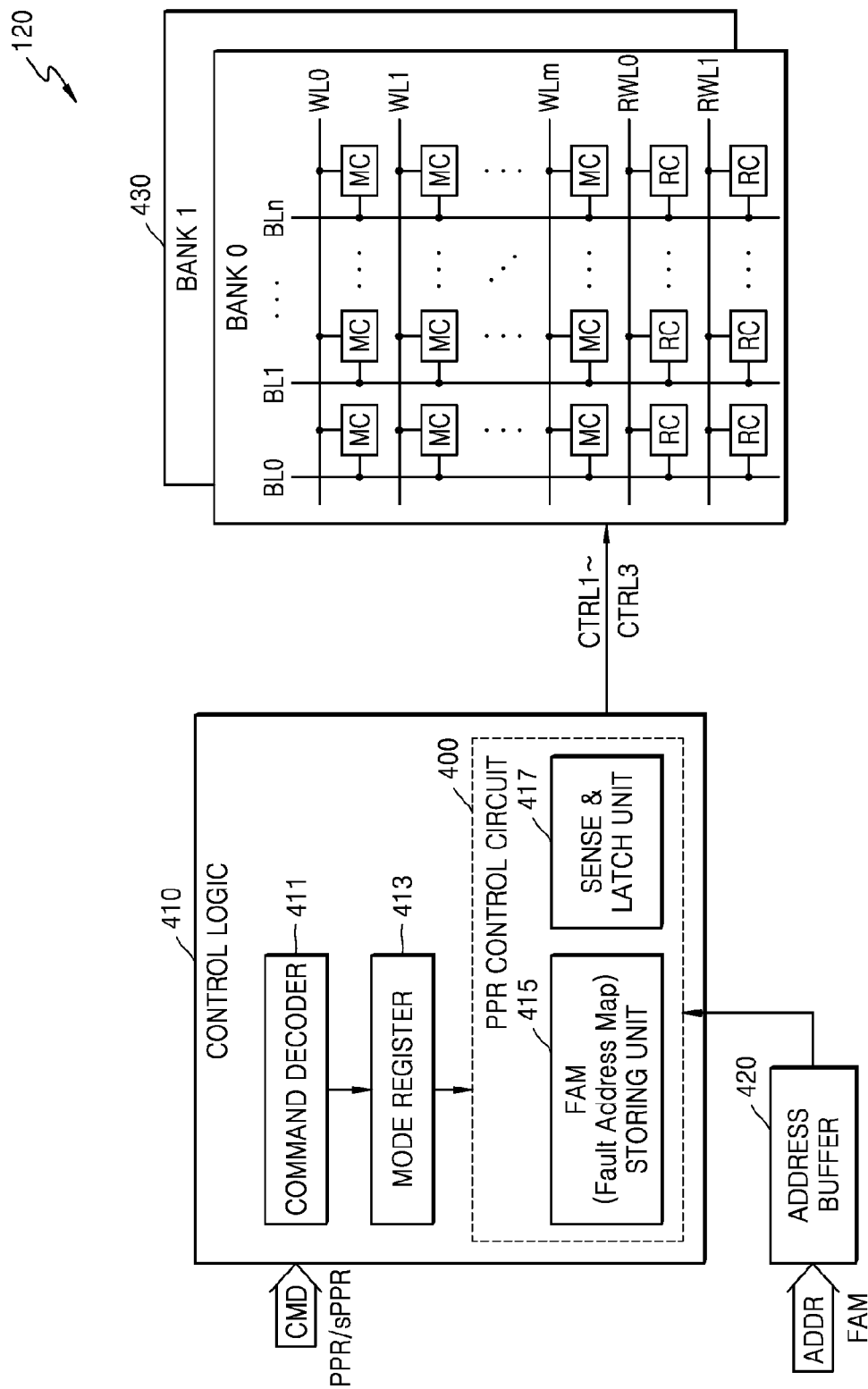
FIGS. 4A and 4B are respective block diagrams illustrating in different examples the memory device 120 of FIG. 1.
Figure 4B:
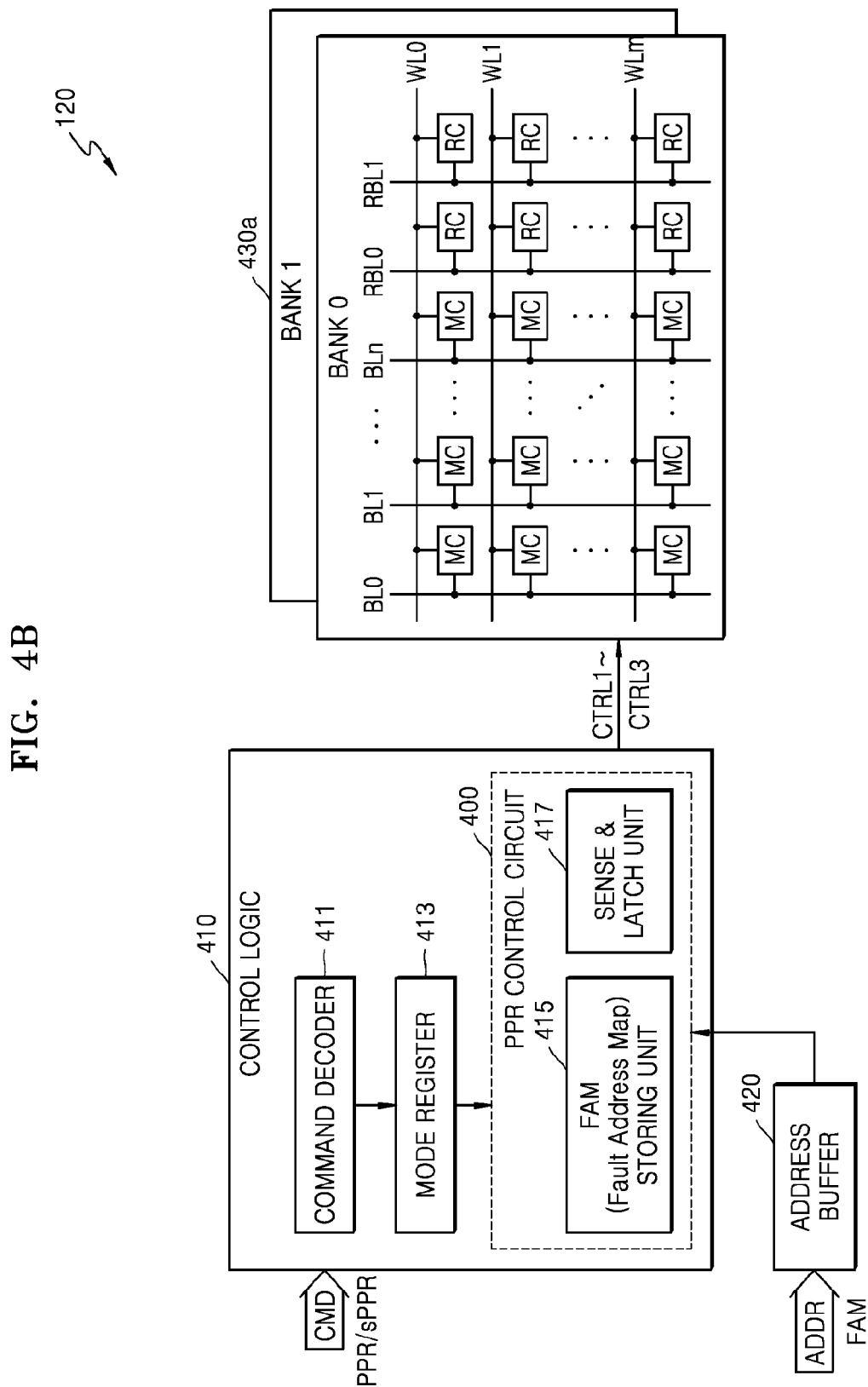

FIGS. 4A and 4B are respective block diagrams illustrating memory device 120 including a PPR control circuit 400 according to embodiments of the inventive concept.

Referring to FIGS. 4A and 4B, the memory device 120 includes control logic 410, an address buffer 420, and a memory cell array 430.

The control logic 410 may be used to control operations of the memory device 120. Thus, the control logic 410 may generate control signals required for the memory device 120 to perform various operations such as a write operation, a read operation, a PPR operation, etc. The control logic 410 may include a command decoder 411 that decodes a command CMD received from the memory controller 110, a mode register 413 that sets (or defines) an operational mode for the memory device 120 by providing a mode set signal, and the PPR control circuit 400 that controls the execution of a PPR operation in accordance with a defined PPR/sPPR mode indicated by the mode set signal.

The command decoder 411 may decode (e.g.,) a write enable signal/WE, a row address strobe signal/RAS, a column address strobe signal/CAS, a chip select signal/CS, a clock CLK, and a clock enable signal CKE in order to generate internal command signals corresponding to the command CMD. The address buffer 420 may receive an address signal ADDR including a bank group address BG, a bank address BA, a row address RA, and a column address CA from a memory controller. A read operation or write operation may be performed in relation to a memory cell (or group of memory cells) in the memory cell array 430 designated on the basis of the address signal ADDR.

Entry into the PPR/sPPR mode may be controlled by a mode register command (e.g., MRS4 of FIG. 2) that instructs the command decoder 411 to set the mode register 413 in the PPR/sPPR mode and an address signal applied to the address buffer 420 for entering the PPR/sPPR mode. According to some embodiments, entry into the PPR/sPPR mode may be controlled using a single address signal (e.g., the address signal A13 of FIG. 2).

The PPR control circuit 400 may include the bad address storage 415 and a sense and latch unit 417. The bad address storage 415 may be used to store a bad address (e.g., an address stored in the form of a Fault Address Map or FAM) that is applied to the address buffer 420 along with an active command applied by the command decoder 411. The bad address storage 415 may include a non-volatile memory that permanently stores the bad address in response to a PPR command, and/or a volatile memory that temporarily stores the bad address in response to a sPPR command. The sense and latch unit 417 may be used to read the bad address (or FAM) stored in the bad address storage 415 in order to generate repair control signals CTRL1 through CTRL3 used to control the execution of a PPR operation in accordance with the indicated PPR/sPPR mode.

Figure 5:
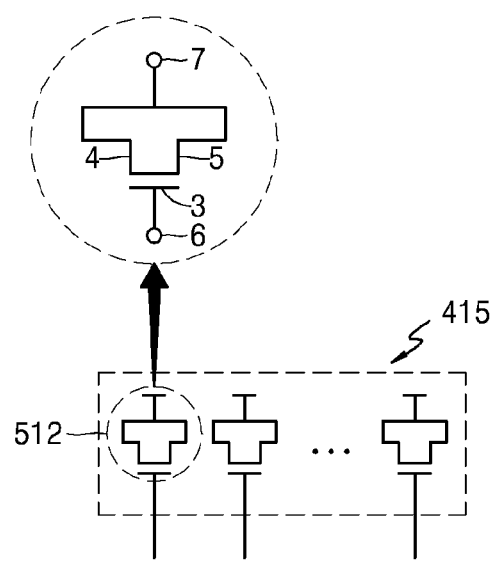
FIG. 5 is a diagram illustrating one example of an approach that may be used to implement the bad address storage 415 of FIGS. 1, 4A and 4B.

As shown in FIG. 5, the non-volatile memory of the bad address storage 415 may be implemented in certain embodiments using an anti-fuse array including anti-fuses 512. The anti-fuse 512 may be embodied by a resistive electric fuse device having electrical properties that are the opposite of those conventionally associated with a fuse device. That is, the anti-fuse 512 will exhibit high resistance when the anti-fuse 512 is not programmed and low resistance when the anti-fuse 512 is programmed.

The anti-fuse 512 commonly has a structure in which a dielectric unit is disposed between conductors, where the anti-fuse 512 is programmed by destroying the dielectric unit using a high voltage applied to the conductors. As a result of programming the anti-fuse 512, the conductors disposed on two opposite sides of the dielectric are short-circuited and the anti-fuse 512 exhibits a low resistance.

In certain embodiments like the one illustrated in FIG. 5, the anti-fuse 512 includes a depletion-type MOS transistor including a source 4 and a drain 5. In an initial state, resistance between a first node 6 connected to a gate electrode 3 and a second node 7 commonly connected to the source 4 and the drain 5 is very high, because the first node 6 and the second node 7 are separated by a gate oxide layer. As a result, the state between the first node 6 and the second node 7 is essentially non-conductive (e.g., a logical low' state or an un-programmed state).

The anti-fuse 512 may be irreversibly switched from a non-conductive state to a conductive state by destroying a gate oxide layer between the first node 6 and the second node 7 using a breakdown voltage. When the gate oxide layer is destroyed, resistance between the first node 6 and the second node 7 is essentially conductive (e.g., a logical "high" state or a programmed state). The time period required to program the anti-fuse 512 by destroying the gate oxide layer may correspond to the program time tPGM of FIG. 2 in certain embodiments of the inventive concept.

In order to reduce the time necessary to store a bad address in the bad address storage 415, the PPR control circuit 400 may support an sPPR operation. As described above, this alternate bad address storing approach, wherein a bad address is temporarily written to a volatile memory instead of being permanently programmed to the non-volatile memory, may take only dozens of nanoseconds, as compared with hundreds of milliseconds or more.

In certain embodiments of the inventive concept, the non-volatile memory of the bad address storage 415 may include one of an e-fuse array, a NAND flash memory, a NOR flash memory, a magnetic random access memory (MRAM), a spin torque transfer MRAM (STT-MRAM), a resistive random access memory (ReRAM), and a phase change random access memory (PRAM).

In FIGS. 4A and 4B, the memory cell array 430 includes one or more banks BANK0 and BANK1, where the banks BANK0 and BANK1 respectively include memory cells MC connected by word lines WL0 through WLm and bit lines BL0 through BLn. Redundancy memory cells RC may be connected to redundancy word lines RWL0 and RWL1 (FIG. 4A) and/or redundancy bit lines RBL0 and RBL1 (FIG. 4B). In the embodiment of FIG. 4A, the memory cells MC and the redundancy memory cells RC share bit lines BL0 through BLn and may be accessed by using a common column address. Although only two (2) redundancy word lines RWL0 and RWL1 are shown in FIG. 4A for convenience of illustration, any reasonable number of redundancy word lines may be used.

During a normal read/write operation, each of the banks BANK0 and BANK1 of the memory cell array 430 may be connected to a row decoder and a word line driver for selecting at least one of the word lines WL0 through WLm based on an input row address (IRA) and may be connected to a column decoder and a column selecting circuit for selecting one of the bit lines BL0 through BLn based on an input column address (ICA).

During a PPR operation, the memory cell array 430 may be controlled to write (or copy) data stored in memory cells connected to a bad word line (FWL) selected in response to a bad address into memory cells connected to a redundancy word line (RWL) according to repair control signals CTRL1 through CTRL3. If an input row address is assumed to be an address accessing a bad memory cell, the memory cell array 430 may functionally replace the bad memory cell with a redundancy memory cell by instead selecting in response to the input row address the redundancy word line RWL.

Referring to FIG. 4B, as compared with the memory cell array 430 of FIG. 4A, in a memory cell array 430a, each of the banks BANK0 and BANK1 includes memory cells MC connected to word lines WL0 through WLm and bit lines BL0 through BLn, as well as including redundancy memory cells RC connected to the word lines WL0 through WLm and one or more redundancy bit lines RBL0 and RBL1.

In FIG. 4B, the PPR control circuit 400 is again assumed to include the bad address storage 415 and sensing and latching unit 417. The bad address storage 415 may be used to store a bad address applied to the address buffer 420 along with an active command applied by the command decoder 411. The bad address storage 415 may include a non-volatile memory that permanently stores the bad address in response to a PPR command and a volatile memory that temporarily stores the bad address in response to a PPR command. The sensing and latching unit 417 may be used to read a bad address (e.g., from a FAM) stored in the bad address storage 415 and generate repair control signals CTRL1 through CTRL3 that control the execution of a PPR operation in accordance with a designated PPR/sPPR mode.

The memory cell array 430a of FIG. 4B may perform a PPR operation during which data stored in memory cells connected to a bad bit line and selected by a bad column address in response to the repair control signals CTRL1 through CTRL3 is written (or copied) to redundancy memory cells connected to a redundancy bit line RBL. According to some embodiments, the PPR operation may also write (or program) a known data pattern (e.g., all '0' data, all '1' data or a known pattern of data values) to redundancy memory cells connected to the redundancy bit line RBL.

In the foregoing description of memory device 120 in FIG. 4B, if an input column address is an address that accesses a bad bit line, the memory cell array 430a may functionally replace a bad memory cell with a redundancy memory cell by instead selecting the redundancy bit line RBL.

Figure 6:
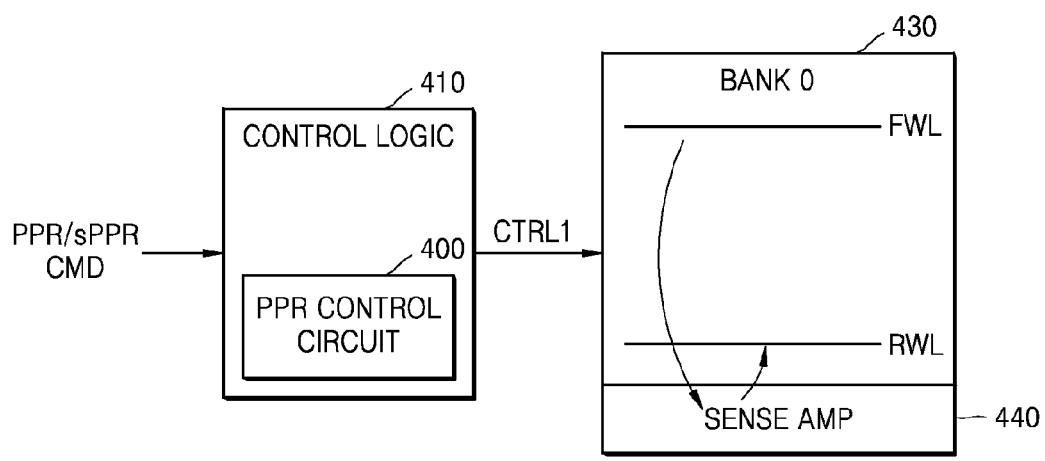
FIGS. 6 and 7 are respective block diagrams illustrating different approaches to the row copy operation of FIG. 3.
Figure 7:
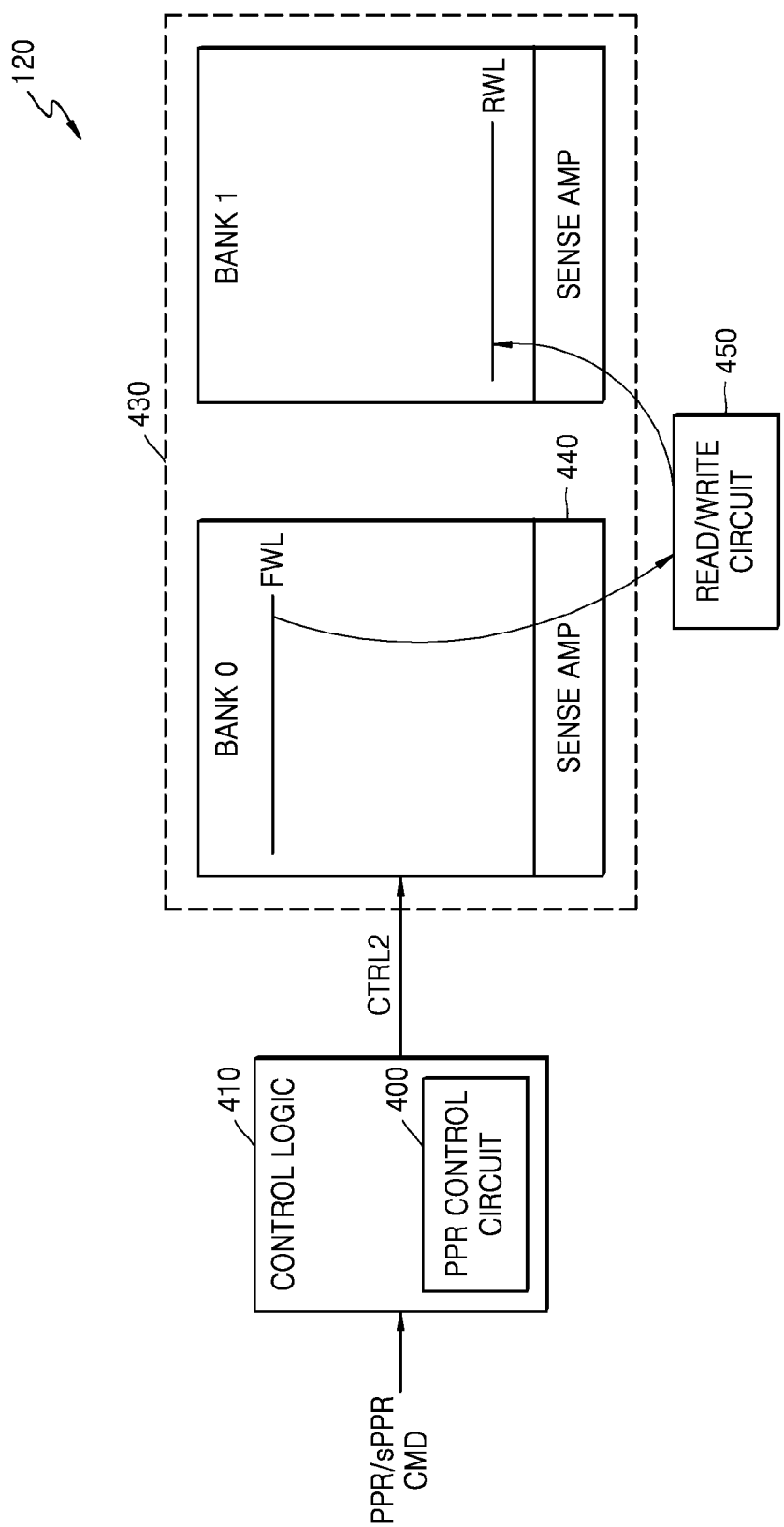

FIGS. 6 and 7 are respective block diagrams further illustrating a row copy operation that may be used in relation to step (S320) of the method summarized in the flowchart of FIG. 3.

Referring to FIGS. 1, 3 and 6, the memory device 120 includes the PPR control circuit 400 that selectively performs a PPR operation in response to a PPR/sPPR command received by the control logic 410. The PPR control circuit 400 may perform a PPR operation, wherein the memory device 120 enters a defined PPR mode, selects a bad address (e.g., using a FAM) along with an active command ACT, receives a write command, determines whether the memory device 120 is a target by checking a data pad DQ based on the write command, programs the selected bad address to the bad address storage 415 when the memory device 120 is the target, receives a pre-charge command after the programming operation is completed, and exits the PPR mode.

The PPR control circuit 400 may be used to generate a first repair control signal CTRL1 that causes the execution of a row copy operation in relation to the memory cell array 430. The row copy operation may be performed such that data stored in memory cells connected to a bad word line (FWL) designated by a bad row address in the first bank BANK0 is read (i.e., sensed, detected, and amplified by a sense amp 440), and thereafter the resulting "read data" is written (or programmed) to redundancy memory cells connected to a redundancy word line of the first bank BANK0. Thus, a first row copy operation executed in response to the first repair control signal CTRL1 may correspond to an internal bank copy operation.

Referring to FIG. 7, in response to a PPR/sPPR command received by the control logic 410, the PPR control circuit 400 may generate a second repair control signal CTRL2 that causes execution of a row copy operation to the memory cell array 430. A row copy operation according to the second repair control signal CTRL2 may be performed, such that data stored by memory cells connected to a bad word line (FWL) corresponding to a bad row address in the first bank BANK0 is read by sense amp 440. The resulting read data is passed (or transferred) to a read/write circuit 450 associated with a competent data path between the first bank BANK0 and a second bank BANK1. From the read/write circuit 450 the copied data may be written (or programmed) to redundancy memory cells connected to a redundancy word line (RWL) of the second bank BANK1. Thus, a second row copy operation executed in response to the second repair control signal CTRL2 may correspond to an inter-bank copy operation.

With reference to FIGS. 2, 4, 6 and 7, the first and second row copy operations corresponding to the first and second repair control signals CTRL1 and CTRL2 may be performed between time T3 at which a bad address is stored in the bad address storage 415 and time T4 at which a pre-charge command PRE is received.

Figure 8:
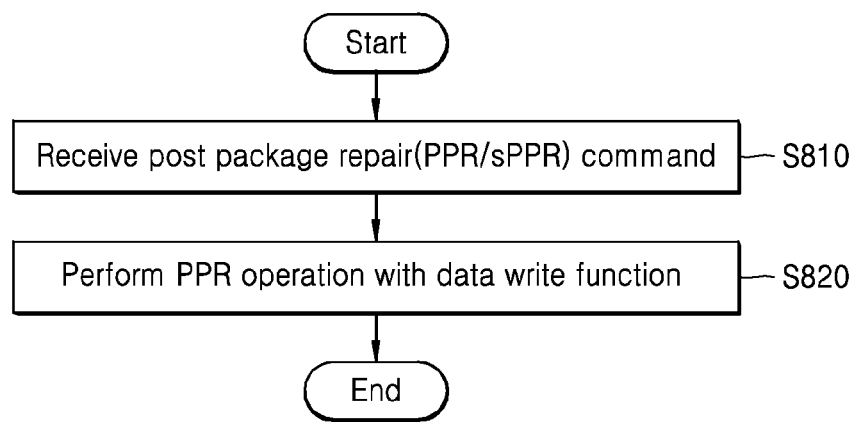
FIG. 8 is a flowchart and FIG. 9 is block diagram collectively illustrating in one example the PPR operation including a known data write operation according to an embodiment of the inventive concept.
Figure 9:
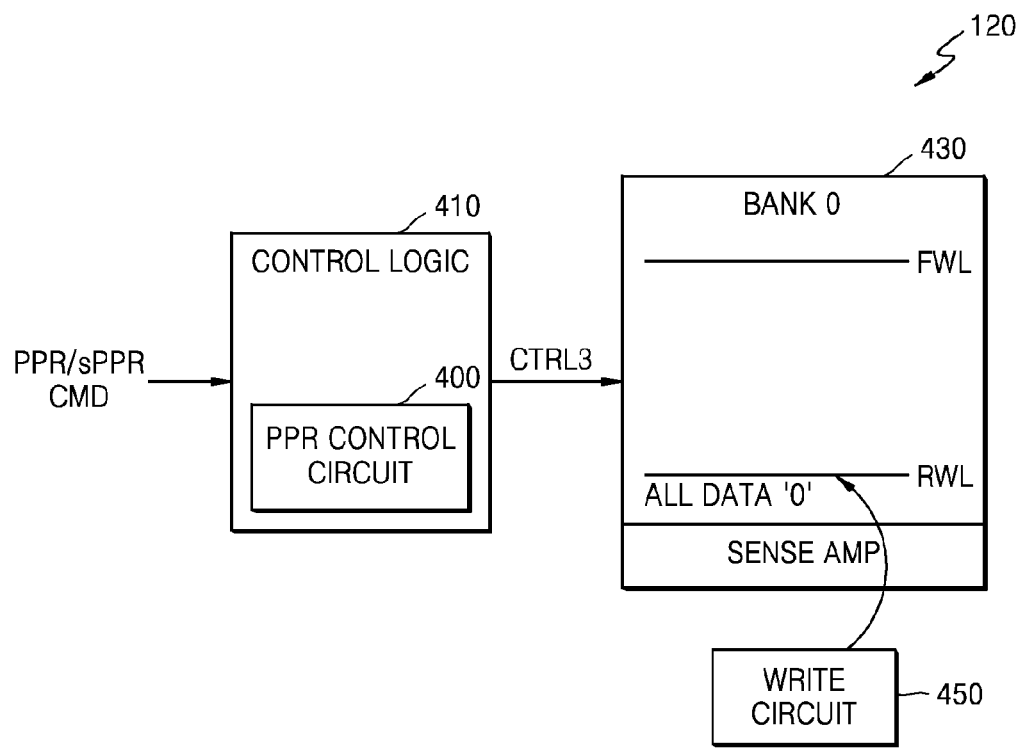

FIG. 8 is a flowchart summarizing in one example a PPR operation including a data write operation that may be executed by a memory system according to embodiments of the inventive concept. FIG. 9 is a block diagram further illustrating the write operation that may be used in relation to step (S820) of the method summarized in the flowchart of FIG. 8. The data write function of FIGS. 8 and 9 is assumed to write all '0' data, but other embodiments of the inventive concept may write any known data pattern in this regard.

Referring to FIGS. 1, 2, 4 and 8, the memory device 120 receives a PPR/sPPR command from the memory controller 110 (S810). The PPR/sPPR command causes a bad row address to be stored in the bad address storage of the memory device 120, as provided by the memory controller 110. The PPR control circuit 400 performs a PPR operation in response to the PPR/sPPR command (S820).

As described above with reference to FIG. 2, the PPR control circuit 400 may perform the PPR operation, such that the memory device 120 enters a PPR mode, selects a bad address FAM along with an active command ACT, receives a write command, checks whether the memory device 120 is a target by checking a data pad DQ based on the write command, programs the bad address applied along with the active command ACT to the bad address storage 415 when the memory device 120 is the target, receives a pre-charge command after the programming operation is completed, and exits the PPR mode.

In addition to the PPR operation described above, the PPR control circuit 400 may further perform a data write operation whereby all '0' data is written to a redundancy row.

Referring to FIG. 9, in response to the PPR/sPPR command received by the control logic 410, the PPR control circuit 400 may generate a third repair control signal CTRL3 that causes the execution of a known data pattern write operation directed to the designated redundancy row of the memory cell array 430. Here, as an example, the known data write operation according to the third repair control signal CTRL3 may be performed, such that all '0' data is written by the read/write circuit 450 to at least some (and potentially all) of the redundancy memory cells connected to a redundancy word line (RWL) replacing the bad word line (FWL) of the first bank BANK0.

With reference to FIGS. 2, 8 and 9, the known data write operation executed in response to the third repair control signal CTRL3 may be performed between time T3 at which a bad address is programmed to the bad address storage 415 and time T4 at which a pre-charge command PRE is received.

At this point it should be noted that the writing of a known data pattern, however, constituted, with regard to a redundancy word line (or a redundancy bit line) is performed regardless of the actual data written (or programmed) to the memory cells of the bad word line (or bad bit line). This being the case and absent further consideration, the replacing of the bad word line with the redundancy word line would probably introduce multiple data errors into the data now stored by the redundancy word line RWL. In such circumstances, since the host 50—which has is higher-level of hardware performance than the memory device 120—may be used to correct (or update) the data stored by the memory cells of the redundancy word line using a competent form of error correction and/or detection. For example, the host 50 may detect/correct bit errors using checksum approach that references a duplicate set of data stored in another memory device of the memory system 100, or some other conventionally understood error correction code (ECC) approach.

Figure 10B:
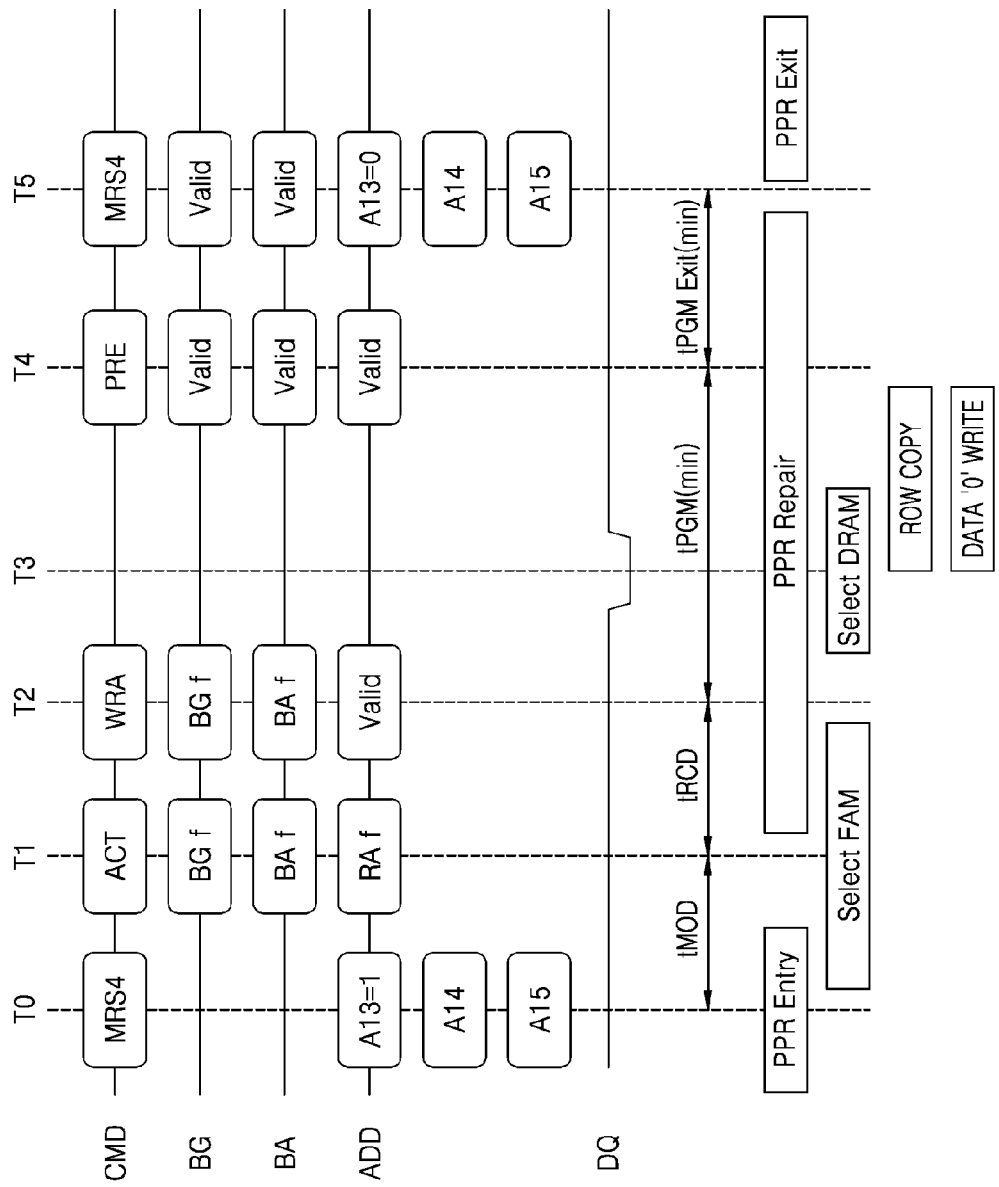

FIG. 10A is a table listing relationships between various PPR operation modes and corresponding address signals. FIG. 10B is a timing diagram further illustrating in another example a PPR operation that may be performed by the memory device 120 of FIG. 1 using the relationships illustrated in FIG. 10A.

Referring to FIGS. 1, 2, 10A and 10B, various PPR operations may be performed by the memory system 100 of FIG. 1. Examples include a PPR operation including a row copy operation, an sPPR operation including a row copy operation, a PPR operation including an all '0' data write operation, and an sPPR operation including an all '0' data write operation. In the table of FIG. 10A, command differentiation between these four examples is made using address bits A14 and A15. Referring to logic values of address bits A14 and A15, one of the four PPR operations may be determined. Here again, an all '0' data write operation is used as one example of different known data write operations that may be used in various embodiments of the inventive concept.

Referring to FIG. 10B, and in comparison with the timing diagram of FIG. 2, three address signals are input along with the mode register command MRS4 in order to enter a particular PPR mode. For example, address signals A13, A14, and A15 are input. As the address signal A13 is '1', the memory device enters a PPR mode, the particular nature of which is further determined by the values of address signals A14 and A15.

From this point, the approach illustrated in FIG. 10B is the same as that illustrated in FIG. 2, excepting only the exit from the PPR mode in relation to address signals A13, A14 and A15 at time T5.

Figure 11:
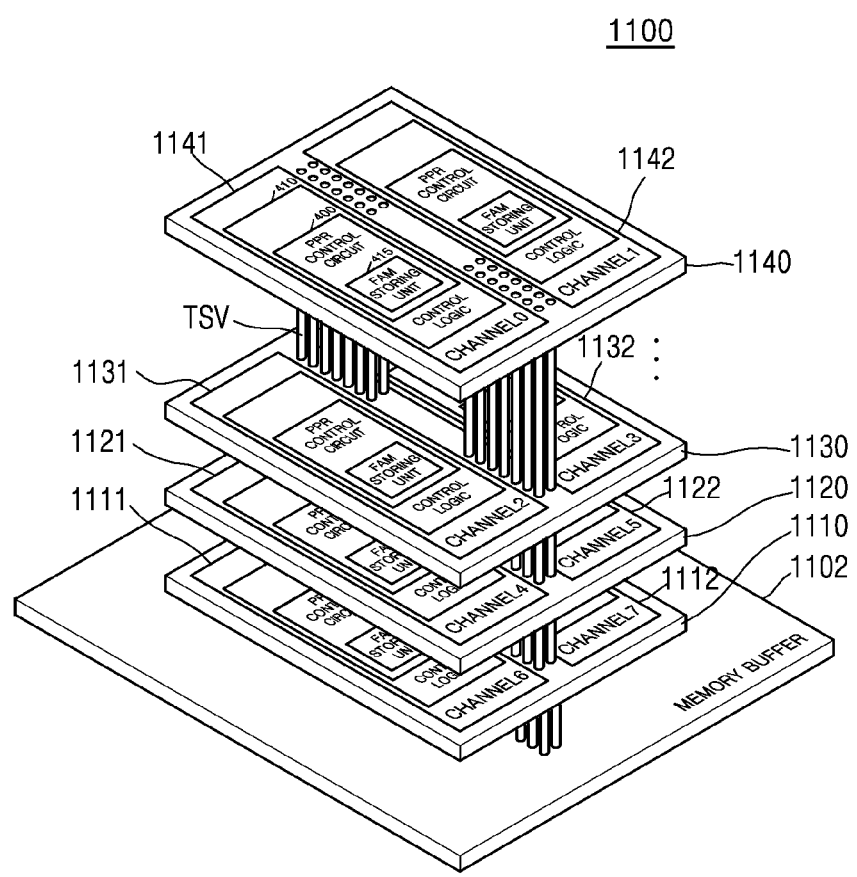
FIG. 11 is a diagram showing a multi-chip package including a PPR control circuit according to embodiments.

FIG. 11 is a perspective diagram illustrating a multi-chip package including a memory system including a PPR control circuit according to an embodiment of the inventive concept. The multi-chip package is a semiconductor package including a stacked plurality of semiconductor chips of a same type or various types.

Referring to FIG. 11, a multi-chip package 1100 may include a memory buffer 1102 below stacked memory layers 1110, 1120, 1130, and 1140. The memory layers 1110, 1120, 1130, and 1140 may constitute a plurality of independent interfaces that are referred to as channels. The memory layers 1110, 1120, 1130, and 1140 may include two channels 1111-1112, 1121-1122, 1131-1132, and 1141-1142, respectively. The channels 1111, 1112, 1121, 1122, 1131, 1132, 1141, and 1142 include independent memory banks and are independently clocked.

In the illustrated embodiment of FIG. 11, the multi-chip package 1100 includes four (4), stacked memory layers 1110, 1120, 1130, and 1140 constituting 8 channels. From two to eight memory layers may be stacked in the multi-chip package 1100, where each of the memory layers 1110, 1120, 1130, and 1140 may include from one to four channels. According to embodiments, a single channel may be distributed over the plurality of memory layers 1110, 1120, 1130, and 1140.

The memory buffer 1102 may provide a signal distributing function for receiving a command, an address, a clock, and data from the memory controller 110 (FIG. 1) and providing the received command, the received address, the received clock, and the received data to the memory layers 1110, 1120, 1130, and 1140. Since the memory buffer 1102 buffers all of a command, an address, a clock, and data, the memory controller 110 may interface with the memory layers 1110, 1120, 1130, and 1140 by driving only the load of the memory buffer 1102.

The memory buffer 1102 and the memory layers 1110, 1120, 1130, and 1140 may exchange signals with each other via through silicon vias (TSV). The memory buffer 1102 may communicate with an external memory controller via a conductive unit formed on an outer surface of the multi-chip package 1100, e.g., solder balls.

The channels 1111, 1112, 1121, 1122, 1131, 1132, 1141, and 1142 of the memory layers 1110, 1120, 1130, and 1140 may include the PPR control circuit 400. Each of the channels 1111, 1112, 1121, 1122, 1131, 1132, 1141, and 1142 may store a bad address FAM to the bad address storage 415 by using the PPR control circuit 400 based on a PPR/sPPR command. The bad address storage 415 may include a non-volatile memory or a volatile memory. The bad address storage 415 may perform a PPR operation for writing data to redundancy memory cells connected to a redundancy word line for replacing a bad word line selected based on a bad row address or writing data to redundancy memory cells connected to a redundancy bit line for replacing a bad bit line selected based on a bad column address. Data of memory cells connected to a bad word line or data '0' or '1' may be written to redundancy memory cells via an internal bank copy operation or an inter bank copy operation.

Figure 12:
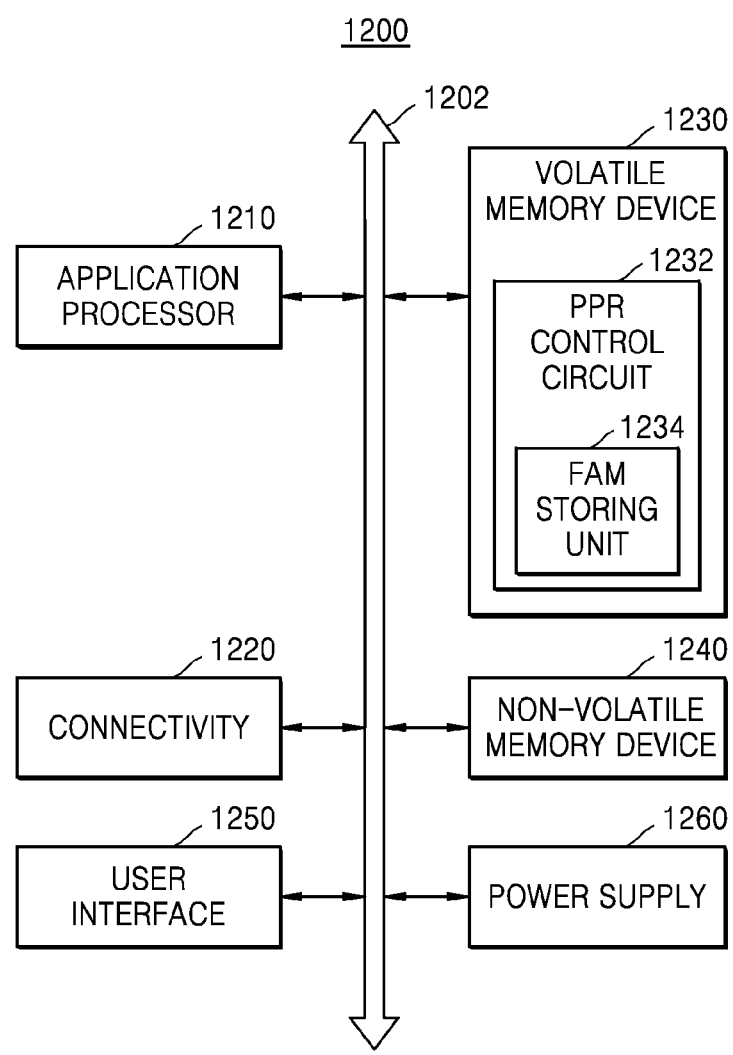
FIG. 12 is a block diagram showing an example of applying a memory device including a PPR control circuit according to embodiments to a mobile system.

FIG. 12 is a block diagram illustrating a mobile system 1200 including a PPR control circuit according to an embodiment of the inventive concept. The mobile system 1200 may include an application processor 1210, a connectivity unit 1220, a first memory device 1230, a second memory device 1240, a user interface 1250, and a power supply 1260 that are connected to one another via a bus 1202. The first memory device 1230 may be a volatile memory, whereas the second memory device 1240 may be a non-volatile memory.

The mobile system 1200 may be an arbitrary mobile system, such as a mobile phone, a smart phone, a personal digital assistant (PDA), a portable multimedia player (PMP), a digital camera, a music player, a portable game console, and a navigation system.

The application processor 1210 may execute an application that provides an internet browser, a game, a moving picture, etc. The application processor 1210 may include a single processor core or a plurality of processor cores. For example, the application processor 1210 may include dual cores, quad cores, hexa cores, etc. Furthermore, the application processor 1210 may further include a cache memory that is arranged inside or outside the application processor 1210.

The connectivity unit 1220 may enable wireless and/or wired communication with an external device. For example, the connectivity unit 1220 may provide an Ethernet communication, a near field communication (NFC), a radio frequency identification (RFID) communication, a mobile telecommunication, a memory card communication, or a universal serial bus (USB) communication, where the connectivity unit 1220 may include a baseband chipset and may support communication protocols including GSM, GRPS, WCDMA, and HSxPA.

The first memory device 1230, which is a volatile memory, may store data processed by the application processor 1210 as a write data or may function as a working memory. The first memory device 1230 may include a PPR control circuit 1232 for performing a PPR operation. The PPR control circuit 1232 may store a bad address to a bad address storage (e.g., a FAM) 1234 in response to a PPR/sPPR command as described above. Accordingly, the bad address storage 1234 may include a non-volatile memory and a volatile memory. The bad address storage 1234 may perform a PPR operation including a known data write function directed to redundancy memory cells connected to a redundancy word line replacing a bad word line, or redundancy memory cells connected to a redundancy bit line replacing a bad bit line. Various PPR operations may effectively provide an internal bank copy operation or an inter bank copy operation.

The second memory device 1240, which is a non-volatile memory, may store a boot image for booting the mobile system 1200. For example, the second memory device 1240 may include an electrically erasable/programmable read-only memory (EEPROM), a flash memory, a phase change random access memory (PRAM), a resistance random access memory (RRAM), a nano floating gate memory (NFGM), a polymer random access memory (PoRAM), a magnetic random access memory (MRAM), a ferroelectric random access memory (FRAM), or the like.

The user interface 1250 may include one or more input devices, such as a keypad and a touch screen, and/or one or more output devices, such as a speaker and a display device. The power supply 1260 may supply an operation voltage for the mobile system 1200. Furthermore, according to some embodiments, the mobile system 1200 may further include a camera image processor (CIP) and may further include a storage device, such as a solid state drive (SSD), a hard disk drive (HDD), and a CD-ROM.

Figure 13:
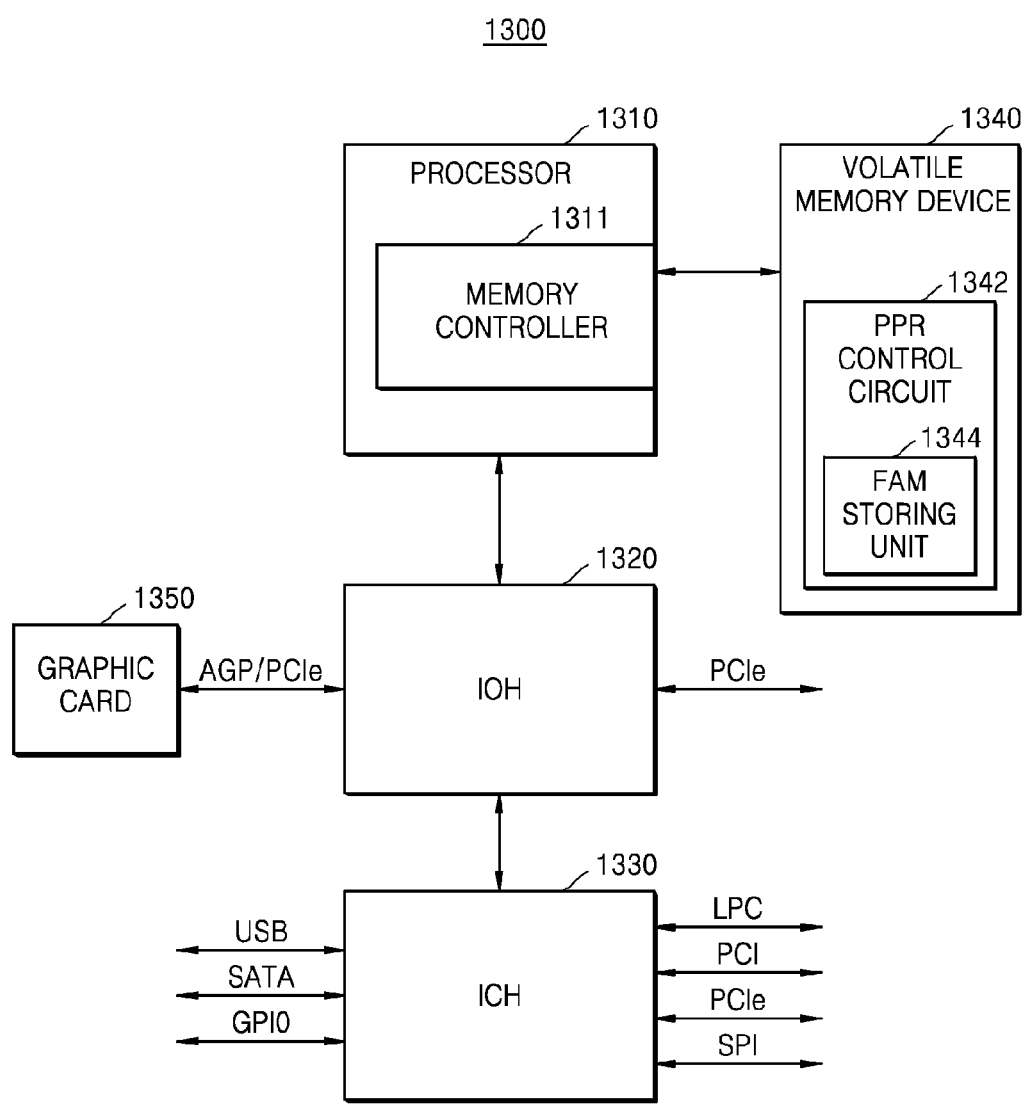
FIG. 13 is a block diagram showing an example of applying a memory device including a PPR control circuit according to embodiments to a computing system.

FIG. 13 is a block diagram illustrating a computer system 1300 that includes a memory system according to an embodiment of the inventive concept.

Referring to FIG. 13, the computer system 1300 includes a processor 1310, an input/output hub 1320, an input/output controller hub 1330, a memory device 1340, and a graphic card 1350. According to some embodiments, the computer system 1300 may be an arbitrary computing system, such as a personal computer (PC), a server computer, a workstation, a laptop computer, a mobile phone, a smart phone, a personal digital assistant (PDA), a portable multimedia player (PMP), a digital camera, a digital television (TV), a set-top box, a music player, a portable game console, and a navigation system.

The processor 1310 may perform various computing functions, such as particular calculations or tasks. For example, the processor 1310 may be a microprocessor or a central processing unit (CPU). According to some embodiments, the processor 1310 may include a single processor core or a plurality of processor cores. For example, the processor 1310 may include dual cores, quad cores, hexa cores, etc. Furthermore, although FIG. 13 shows the computer system 1300 including the single processor 1310, the computer system 1300 may include a plurality of processors according to some embodiments. Furthermore, the processor 1310 may further include a cache memory that is arranged inside or outside the processor 1310.

The processor 1310 may include a memory controller 1311 that controls operations of the memory device 1340. The memory controller 1311 included in the processor 1310 may be referred to as an integrated memory controller (IMC). According to some embodiments, the memory controller 1311 may be arranged inside the input/output hub 1320. The input/output hub 1320 including the memory controller 1311 may be referred to as a memory controller hub (MCH).

The memory device 1340 may include a PPR control circuit 1342 that controls to perform a PPR operation. The PPR control circuit 1342 may store a bad address to a bad address storage 1344 (e.g., using a FAM approach) in response to a PPR/sPPR command. The bad address storage 1344 may include a non-volatile memory or a volatile memory. The bad address storage 1344 may perform a PPR operation for writing data to redundancy memory cells connected to a redundancy word line for replacing a bad word line selected based on a bad row address or writing data to redundancy memory cells connected to a redundancy bit line for replacing a bad bit line selected based on a bad column address. Data of memory cells connected to a bad word line or data '0' or '1' may be written to redundancy memory cells via an internal bank copy operation or an inter bank copy operation.

The input/output hub 1320 may manage data transmissions between devices like the graphic card 1350 and the processor 1310. The input/output hub 1320 may be connected to the processor 1310 via various types of interfaces. For example, the input/output hub 1320 and the processor 1310 may be connected to each other via various types of standard interfaces including front side bus (FSB), system bus, HyperTransport, Lighting data transport (LDT), Quick-Path interconnect (QPI), common system interface (CSI), peripheral component interface-express (PCIe), etc. Although FIG. 13 shows the computer system 1300 including the single input/output hub 1320, the computer system 1300 may include a plurality of input/output hubs according to some embodiments.

The input/output hub 1320 may provide various interfaces to devices. For example, the input/output hub 1320 may provide an accelerated graphics port (AGP) interface, a peripheral component interface-express (PCIe) interface, a communications streaming architecture (CSA) interface, etc.

The graphic card 1350 may be connected to the input/output hub 1320 via an AGP or a PCIe. The graphic card 1350 may control a display apparatus (not shown) for displaying images. The graphic card 1350 may include an internal processor for processing image data and an internal semiconductor memory device. According to some embodiments, the input/output hub 1320 may include a graphic device with the graphic card 1350 arranged outside the input/output hub 1320 or may include a graphic device arranged inside the input/output hub 1320 instead of the graphic card 1350. A graphic device included in the input/output hub 1320 may be referred to as an integrated graphic device. Furthermore, the input/output hub 1320 including a memory controller and a graphic device may be referred to as a graphics and memory controller hub (GMCH).

The input/output controller hub 1330 may perform data buffering and interface arbitration for efficient operations of various system interfaces. The input/output controller hub 1330 may be connected to the input/output hub 1320 via an internal bus. For example, the input/output hub 1320 and the input/output controller hub 1330 may be connected to each other via direct media interface (DMI), hub interface, enterprise Southbridge interface (ESI), PCIe, etc.

The input/output controller hub 1330 may provide various interfaces to peripheral devices. For example, the input/output controller hub 1330 may provide a universal serial bus (USB) port, a serial advanced technology attachment (SATA), a general purpose input/output (GPIO), a low pin count (LPC) bus, a serial peripheral interface (SPI), a PCI, a PCIe, etc.

According to some embodiments, two or more of the processor 1310, the input/output hub 1320, and the input/output controller hub 1330 may be embodied as a single chipset.

While the inventive concept has been particularly shown and described with reference to embodiments thereof, it will be understood that various changes in form and details may be made therein without departing from the scope of the following claims.

What is claimed is:

1. A memory device that receives from a memory controller a bad row address designating a bad row associated with a bad word line and one of a normal post package repair (PPR) command and a fast PPR (sPPR) command, the memory device comprising:
a memory cell array including memory cells connected to word lines and bit lines, and redundancy memory cells connected to a redundancy word line and the bit lines; and
a control logic configured to control execution of a PPR operation by the memory device,
wherein the control logic comprises a PPR control circuit that programs the bad row address to a non-volatile memory during a normal PPR operation in response to the normal PPR command, and programs the bad row address to a volatile memory during a fast PPR operation in response to the fast PPR command, and replaces the bad row in the memory cell array with a redundancy row associated with the redundancy word line.

2. The memory device of claim 1, wherein the replacing of the bad row in the memory cell array with the redundancy row comprises copying data from memory cells connected to the bad row to redundancy memory cells connected to the redundancy row.

3. The memory device of claim 2, further comprising an address buffer that receives the bad row address from the memory controller and provides the bad row address to the control logic.

4. The memory device of claim 3, wherein the control logic further comprises:
a command decoder that decodes the one of the normal PPR command and fast PPR command received from the memory controller; and
a mode register responsive to an output of the command decoder that sets a PPR mode for the memory device by generating a mode set signal.

5. The memory device of claim 4, wherein the PPR control circuit selects a repair control signal from among a plurality of repair control signals in response to the mode set signal and provides the selected repair control signal to the memory cell array.

6. The memory device of claim 5, wherein the memory cell array executes the normal PPR operation in response to one of the plurality of repair control signals and executes the fast PPR operation in response to another one of the plurality of repair control signals.

7. The memory device of claim 2, wherein the normal PPR operation is executed during a first program time and the fast PPR operation is executed during a second program time shorter than the first program time.

8. The memory device of claim 2, wherein the PPR control circuit comprises:
a bad address storage that stores the bad row address; and
a sensing and latching unit that reads the bad row address from the bad address storage and generates a repair control signal provided to the memory cell array that causes the replacing of the bad row in the memory cell array with the redundancy row.

9. The memory device of claim 2, wherein memory cells of the memory cell array are arranged according to a first bank and a second bank, and the normal PPR operation is an internal bank copy operation wherein the bad word line and the redundancy word line are each disposed in the first bank.

10. The memory device of claim 2, wherein memory cells of the memory cell array are arranged according to a first bank and a second bank, and the normal PPR operation is an inter bank copy operation wherein the bad word line is disposed in the first bank and the redundancy word line is disposed in the second bank.

11. The memory device of claim 1, wherein the replacing of the bad row in the memory cell array with the redundancy row comprises writing a known data pattern to the redundancy memory cells connected to the redundancy row.

12. A memory device that receives from a memory controller a bad column address designating a bad column associated with a bad bit line and one of a normal post package repair (PPR) command and a fast PPR (sPPR) command, the memory device comprising:
a memory cell array including memory cells connected to word lines and bit lines, and redundancy memory cells connected to a redundancy bit line and the word lines; and
a control logic configured to control execution of a PPR operation by the memory device, wherein the control logic comprises a PPR control circuit that programs the bad column address to a non-volatile memory during a normal PPR operation in response to the normal PPR command, and programs the bad column address to a volatile memory during a fast PPR operation in response to the fast PPR command, and replaces the bad column in the memory cell array with a redundancy column associated with the redundancy bit line.

13. The memory device of claim 12, wherein the replacing of the bad column in the memory cell array comprises copying data from memory cells connected to the bad column to redundancy memory cells connected to the redundancy column.

14. The memory device of claim 13, further comprising an address buffer that receives the bad row address from the memory controller and provides the bad row address to the control logic, wherein the control logic further comprises a command decoder that decodes the one of the normal PPR command and fast PPR command received from the memory controller, and a mode register responsive to an output of the command decoder that sets a PPR mode for the memory device by generating a mode set signal.

15. The memory device of claim 14, wherein the PPR control circuit selects a repair control signal from among a plurality of repair control signals in response to the mode set signal and provides the selected repair control signal to the memory cell array.

16. The memory device of claim 15, wherein the memory cell array executes the normal PPR operation in response to one of the plurality of repair control signals and executes the fast PPR operation in response to another one of the plurality of repair control signals.

17. The memory device of claim 13, wherein the normal PPR operation is executed during a first program time and the fast PPR operation is executed during a second program time shorter than the first program time.

18. The memory device of claim 13, wherein the replacing of the bad column in the memory cell array with the redundancy column comprises writing a known data pattern to the redundancy memory cells connected to the redundancy row.

19. A method of operating a memory device which includes memory cells connected to word lines and bit lines, and redundancy memory cells connected to one of a redundancy bit line and a redundancy word line, the method comprising:

entering a one of a normal post package repair (PPR) mode or a fast PPR mode in response to a received PPR command and a bad address, the bad address being one of: a bad column address designating a bad column and a bad row address designating a bad row;

when in the normal PPR mode, storing the bad address to a non-volatile memory;

when in the fast PPR mode, storing the bad address to a volatile memory;

when the bad address is the bad column address, replacing the bad column in the memory cell array with a redundancy column associated with the redundancy bit line;

when the bad address is the bad row address, replacing the bad row in the memory cell array with a redundancy row associated with the redundancy word line; and writing data to the redundancy memory cells replacing memory cells selected by the bad address.

* * * * *